(12) United States Patent
Kumar

(10) Patent No.: US 6,560,136 B1
(45) Date of Patent: May 6, 2003

(54) SINGLE-PORT MEMORY CELL

(75) Inventor: Jain Raj Kumar, Singapur (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/806,395

(22) PCT Filed: Sep. 29, 1999

(86) PCT No.: PCT/DE99/03133

§ 371 (c)(1),
(2), (4) Date: Jun. 12, 2001

(87) PCT Pub. No.: WO00/19444

PCT Pub. Date: Apr. 6, 2000

(30) Foreign Application Priority Data

Sep. 30, 1998 (DE) .......................................... 198 45 035

(51) Int. Cl.$^7$ .............................................. G11C 17/00
(52) U.S. Cl. ........................ 365/104; 365/149; 365/150
(58) Field of Search ................................. 365/149, 150

(56) References Cited

U.S. PATENT DOCUMENTS

| | | | | |
|---|---|---|---|---|
| 3,876,993 | A | 4/1975 | Cavanaugh ................. | 340/173 |
| 3,943,496 | A | 3/1976 | Padgett et al. ............... | 340/173 |
| 4,203,159 | A | 5/1980 | Wanlass ....................... | 365/222 |
| 4,292,677 | A | 9/1981 | Boll ............................. | 365/222 |
| 5,646,903 | A | 7/1997 | Johnson .................. | 365/230.05 |
| 5,691,935 | A | * 11/1997 | Douglass .................... | 365/149 |
| 5,828,610 | A | * 10/1998 | Rogers et al. .............. | 365/203 |

FOREIGN PATENT DOCUMENTS

EP    0 188 769    7/1986    ........... G11C/11/24

OTHER PUBLICATIONS

"Read/Write Dynamic Memory Using Two Devices Per Cell and Having Internal Refresh", IBM Technical Disclosure Bulletin, vol. 23, No. 10, pp. 4620–4621, Mar. 1981.

* cited by examiner

*Primary Examiner*—David Nelms
*Assistant Examiner*—Connie C. Yoha
(74) *Attorney, Agent, or Firm*—Fish & Richardson P.C.

(57) ABSTRACT

A single-port memory cell arrangement includes a multiplicity of single-port memory cells, each having a selection transistor and a memory transistor. The selection transistor has a control terminal connected to a word line, and a load-path connected to a data line. The memory transistor has a control terminal connected to a supply potential, and a load-path connected to the second end of the selection-transistor's load-path. The memory transistor is configured to switch, in response to a signal on the data line, between first and second potentials corresponding to two memory states. These potentials and the supply potential are selected such that first and second ends of the memory-transistor-load-path are at the same potential. The memory cell also includes a controllable switch having a first terminal connected to a supply line, and a second terminal connected to the second end of the memory-transistor-load-path. A single charging device assigned to the single-port memory cells provides providing a precharging potential. From time to time, the charging device recharges a selected memory transistor through the supply line and a selected controllable switch corresponding to that memory transistor.

14 Claims, 3 Drawing Sheets

SINGLE-PORT MEMORY CELL

The invention relates to a single-port memory cell and a semiconductor memory having single-port memory cells.

Single-port memory cells is a term designating all memory cells which have only a single selection line and a single data line. Hereinafter, unless expressly specified otherwise, all single-port memory cells are designated as memory cells for short.

A dynamic single-port memory cell (dynamic random access memory; DRAM) contains a selection transistor and a capacitive element. The capacitive element is in this case typically designed as a storage capacitor. As an alternative, it would also be conceivable for the capacitive element to be realized as a conventional memory transistor whose gate terminal is connected to a supply potential.

The particular advantage of DRAM memory cells consists in their extremely space-saving realization on a semiconductor chip, as a result of which DRAM semiconductor memories can be fabricated extremely cost-effectively. On account of the small number of circuit elements of a DRAM memory cell and hence the small outlay on wiring, DRAM semiconductor memories advantageously have very short access times, as a result of which their performance can additionally be optimized. However, in DRAM memory cells, a respective terminal of the capacitive element is at a "floating" potential, i.e. at an undefined potential. DRAM memory cells therefore have to be recharged at regular intervals (refresh operation). During this refresh operation, it is not possible to read from or write to the DRAM memory cell, as a result of which undefined switching states can never be completely avoided.

U.S. Pat. No. 4,203,159 describes a single-port memory cell arrangement having single-port memory cells having a capacitive element and a selection transistor, which are arranged between a data line and a supply line. Each cell has a controllable switch via which the capacitive element can be recharged.

Furthermore, U.S. Pat. No. 4,292,677 discloses using a MOS arrangement as a capacitive element. This MOS arrangement comprises a metal plate which, in a manner isolated by an oxide layer, lies above a semiconducting region of a main area of a semiconductor substrate. Corresponding potentials on the metal plate and the semiconductor substrate are used to produce a depleted region in the semiconductor region below the metal plate. In this region it is possible to store charges for generating logic states.

A static single-port memory cell (static random access memory; SRAM) typically contains six transistors: in each case two selection transistors (transfer gates) and four memory transistors (inverters). Although such an SRAM memory cell has defined potential states in its output path, as a result of which the information stored in the memory cell is preserved, distinctly more transistor elements are required for an SRAM memory cell in comparison with the DRAM memory cell described above. Therefore, also on account of the very much greater outlay on wiring, such an SRAM memory cell has an areally more complicated design than a DRAM memory cell. In particular highly complex semiconductor memories, in which area optimization constitutes the most important boundary condition, are therefore preferably constructed from DRAM memory cells.

The present invention is therefore based on the object of providing a new design of a single-port memory cell.

According to the invention, this object is achieved by means of a single-port memory cell having the features of patent claim 1.

In the preferred configuration, the single-port memory cell according to the invention in each case has a CMOS memory transistor and a CMOS selection transistor, whose load paths are connected in series, and this series circuit is arranged between a data line and a charging device. This arrangement makes it possible to provide a single-port memory cell in which a capacitive element can be read from or written to by means of a data processing device and, at the same time, this capacitive element can be recharged by means of the charging device (refresh operation).

Consequently, the new memory cell at least in part combines the DRAM memory cell functionality mentioned in the introduction with that of an SRAM memory cell. From the user's perspective, the memory cell according to the invention behaves like a simple SRAM memory cell since it has defined switching states at every point in time. Consequently, the memory cell can be addressed at any time by a data processing unit. Compared with a conventional SRAM memory cell, the memory cell according to the invention additionally has the advantage of a distinctly reduced chip area. Conventional SRAM memory cells have a total of six transistors, while the memory cell according to the invention only requires a maximum of two or three transistors. Consequently, a saving in area of more than 50% can be realized.

The memory cell according to the invention is particularly advantageous in particular because the capacitive element is designed as a CMOS transistor. In the case of such a CMOS transistor, the load path terminal nodes thereof, i.e. the source terminal and the drain terminal, can coincide with the respective series-connected selection transistor and switching transistor in a space-saving manner. An optimal area design can be provided by virtue of this saving of area-intensive terminal nodes.

Furthermore, on account of the short interconnect lengths, the memory cell according to the invention has an access time which is optimized compared with conventional SRAM memory cells. Such short access times or such a small area requirement on the semiconductor chip has been achievable hitherto only by conventional DRAM memory cells.

The invention is explained in more detail below using the exemplary embodiments specified in the figures of the drawing, in which.

In all the figures of the drawing, identical or functionally identical elements are provided with the same reference symbols, unless specified otherwise.

Figure 1:
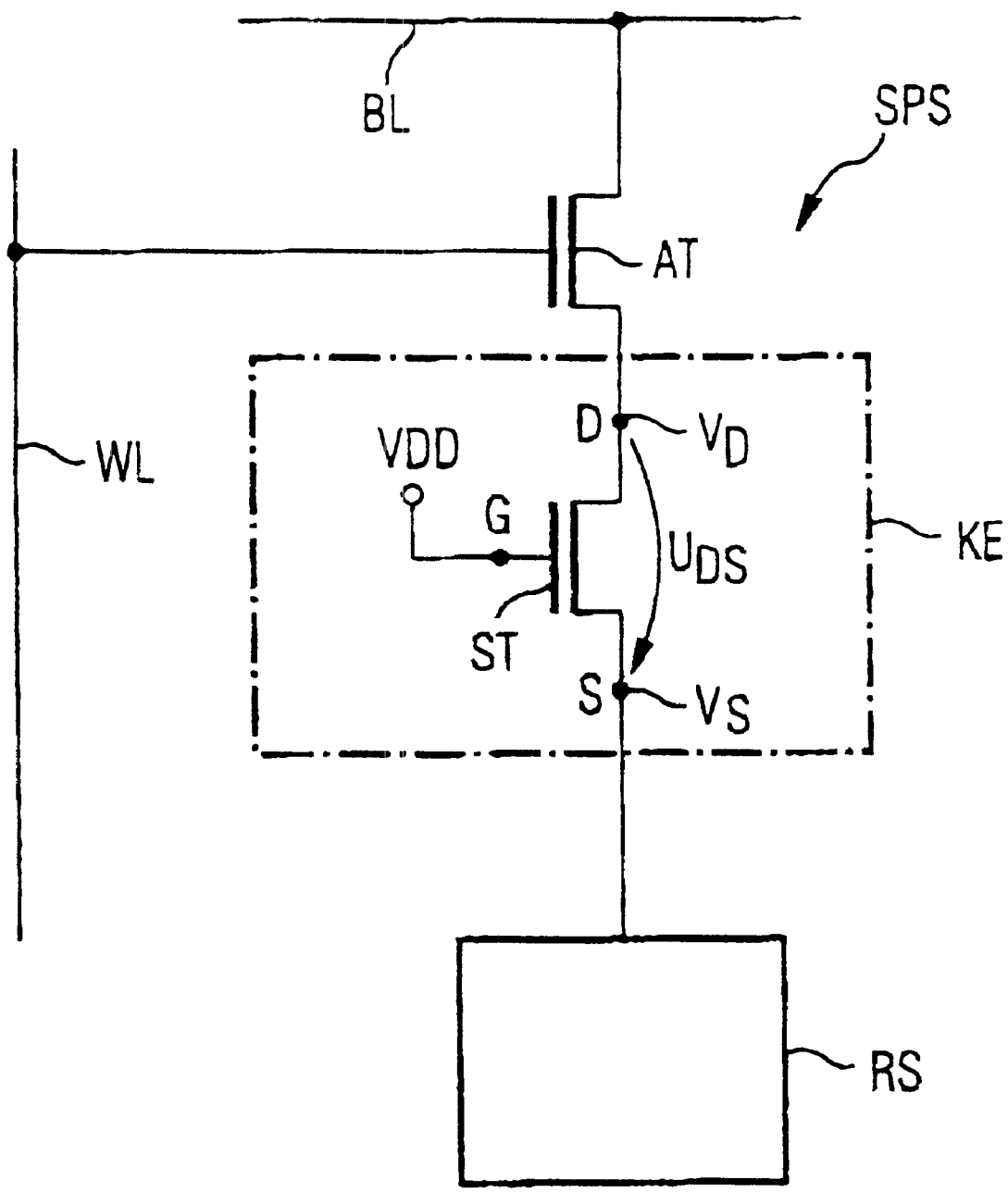
FIG. 1 shows the circuit diagram of a first exemplary embodiment of a memory cell.

FIG. 1 shows the circuit diagram of a memory cell. The memory cell SPS has a selection transistor AT and also a capacitive element KE. In FIG. 1, the capacitive element KE is designed as a memory transistor ST, whose gate terminal G is connected to a supply potential VDD. The drain terminal D of the memory transistor ST is connected to a data line BL via the load path of the selection transistor AT. The source terminal S of the memory transistor ST is connected to a charging device RS. The control terminal of the selection transistor AT can be driven via a selection signal of a word line WL. The load paths of the selection transistor AT and of the memory transistor ST are thus connected in series and arranged between the first data line BL and the charging device RS.

The memory cell SPS is connected via the data lines BL to a data processing unit connected downstream (not illustrated in FIG. 1). This data processing unit may be designed for example as a microcomputer, processor, logic circuit, bus, etc. Data can be written to or read from the memory cell SPS, i.e. the memory transistor ST, bidirectionally via the data line BL.

Figure 2:
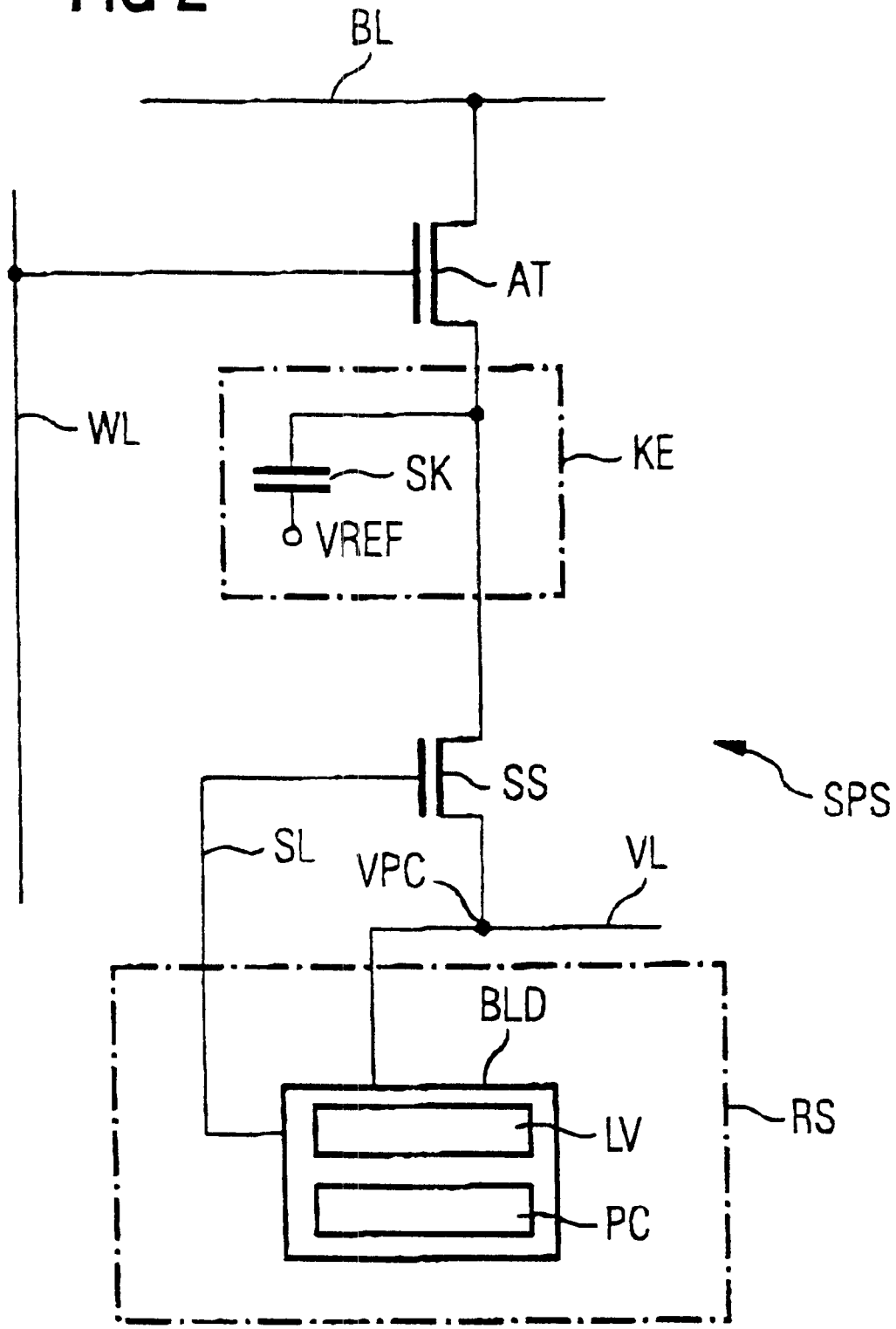
FIG. 2 shows the circuit diagram of a second exemplary embodiment of a further memory cell.

FIG. 2 shows the circuit diagram of a further memory cell, in which an advantageous configuration of the charging device RS is also represented.

In FIG. 2, the capacitive element KE is designed as a storage capacitor SK. The storage capacitor SK is arranged between the load path of the selection transistor AT and the charging device RS and is connected to a reference potential VREF. The charging device RS, which is also referred to as a refresh circuit RS in the technical jargon, contains a bit line decoder BLD. In the present example, the bit line decoder BLD has at least a sense amplifier LV and a precharge circuit PC. The precharge circuit PC provides a charging potential VPC on the output side.

In the present example, a controllable switch SS is provided which is arranged in the memory cell SPS and is designed as a MOSFET. The load path of the controllable switch SS is connected between a terminal of the capacitive element KE and via a supply line VL to the bit line decoder BLD. The control terminal of the controllable switch SS can be driven by the bit line decoder BLD via a control line SL. The signal level stored in the capacitive element of the memory cell SPS can be measured via the sense amplifier LV. If the signal level falls below a predetermined threshold, the controllable switch SS can be controlled into the on state by means of a control signal via the control line SL. The charging potential VPC from the precharge circuit PC is applied to the capacitive element KE via the load path of the controllable reference voltage source. This measure means that a sense amplifier LV, which is complicated in respect of circuitry, is no longer necessary. Moreover, these automated refresh operations make it possible to further reduce the size of the capacitive element KE of the memory cell SPS, since the size of said capacitive element must not be overdimensioned in order to prevent an undesirable loss of data.

Figure 3:
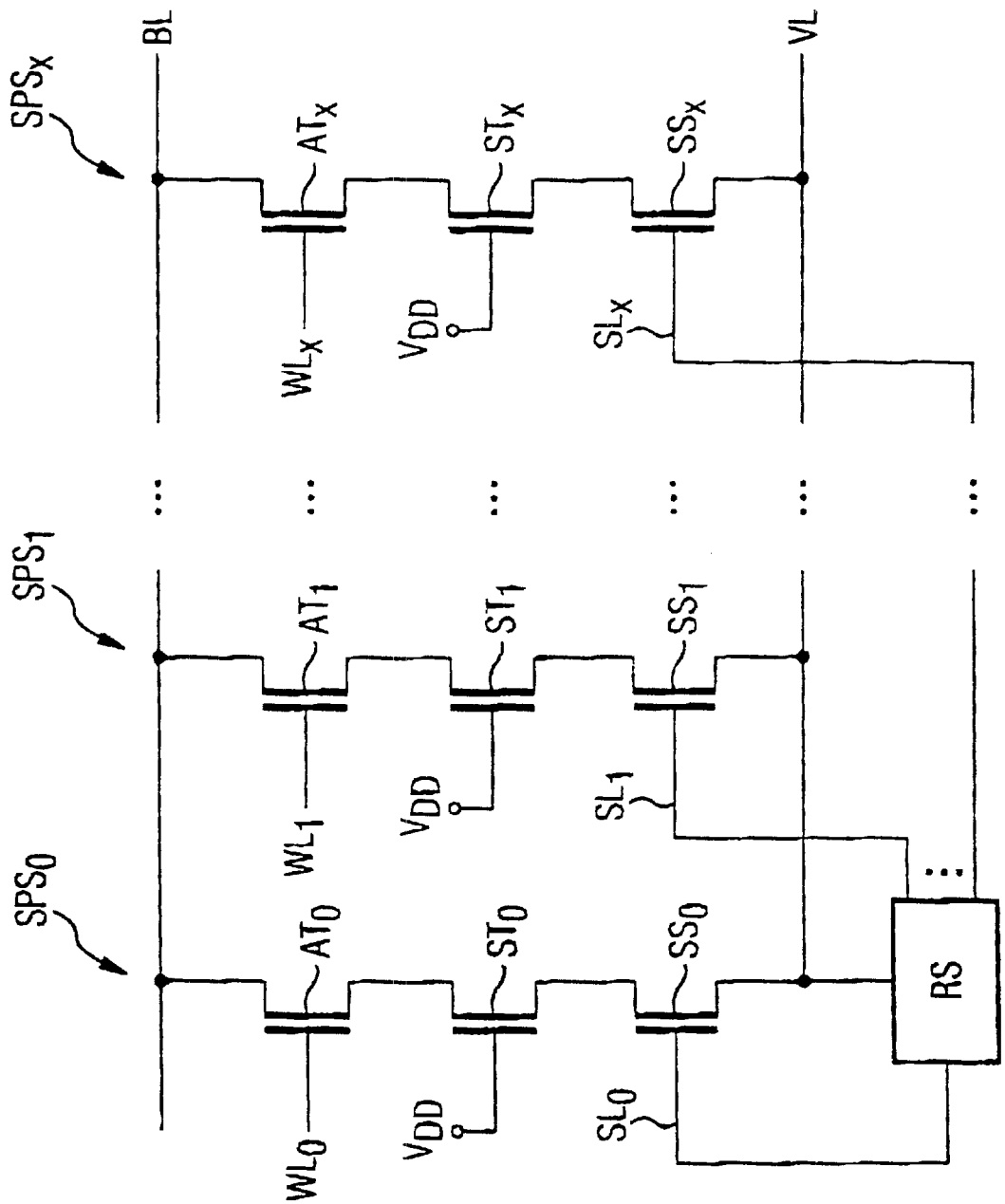
FIG. 3 shows the circuit diagram of an exemplary embodiment with a multiplicity of interlinked memory cells according to the invention.

FIG. 3 shows the circuit diagram of an exemplary embodiment with a multiplicity of interlinked memory cells according to the invention.

FIG. 3 shows a multiplicity of memory cells $SPS_0 \ldots SPS_x$. Each of these memory cells has a selection transistor $AT_0 \ldots AT_x$, a memory transistor $ST_0 \ldots ST_x$ and a controllable switch $SS_0 \ldots SS_x$. These transistors which are connected in series via their load paths are arranged between a data line BL and a supply line VL. The selection transistors $AT_0 \ldots AT_x$, are driven via signals from the respective selection lines $WL_0 \ldots WL_x$. A supply voltage VDD is applied to the control terminals of the memory transistors $ST_0 \ldots ST_x$. The control terminals of the controllable switches $SS_0 \ldots SS_x$ are driven by the charging device RS via corresponding control lines $SL_0 \ldots SL_0$. The particular advantage of this arrangement is that a single charging device RS is provided for driving the corresponding memory cells $SPS_0 \ldots SPS_x$, as a result of which the memory arrangement according to the invention can be designed in an areally optimized manner.

The method of operation of the memory cell SPS according to the invention is briefly explained below with reference to FIG. 1:

During a write operation via the data line DL, the selection transistor AT is controlled into the on state. The capacitive element KE is thereby charged with the potential VDD−Vth if a digital "1" is to be written to the corresponding memory cell SPS, or is discharged to the potential VSS if, for example, a digital "0" is to be written to the corresponding memory cell SPS.

The invention exploits the fact that, for approximately identical potentials at the gate terminal G and the source terminal S of the memory transistor ST, the voltage drop UDS between source and drain terminals is equivalent to the threshold voltage Vth thereof. Since the gate terminal G of the memory transistor ST is connected to the supply potential VDD, source terminal S and drain terminal D of the memory transistor ST have the same potential, i.e. VS=VD= VDD−VT for a digital "1" and VS=VD=VSS for a digital "0". Since the drain potential VD and the source potential VS are at the same potential, both the data processing unit and the refresh circuit RS can access the memory cell SPS without a reduction in the voltage of the memory transistor ST.

Consequently, while the data processing unit accesses the memory cell SPS, i.e. during a read operation or write operation, the refresh circuit RS can simultaneously access the memory cell SPS and recharge it. In this way, the access times to the memory cells of a semiconductor memory can advantageously be significantly reduced.

A further advantage of the invention emerges from the fact that both output terminals of the memory transistor ST, i.e. the drain terminal D and the source terminal S, each have the same potential. This fact means that it is possible to dispense with a contact terminal, which is particularly advantageous with regard to area optimization particularly in DRAM and SRAM memory technology, where the realization of contacts is extremely complicated in respect of area.

In the present exemplary embodiments in accordance with FIGS. 2 and 3, a controllable switch SS is in each case arranged in each memory cell SPS. However, it would also be conceivable to use a single or a few controllable switches SS for all or a plurality of memory cells SPS. It would also be conceivable to arrange the controllable switch SS in the bit line decoder BLD.

The invention is particularly suitable in the case of memory cells produced using CMOS technology. However, the memory cells are not restricted to a specific transistor technology, but rather can be realized by any type of field-effect-controlled, normally on or normally off transistors, typically produced using MOS technology. However, memory cells of bipolar design would also be conceivable.

In a development, it is possible, of course, to employ all known measures according to the prior art for area optimization and for shortening the access time, for example by optimizing the design rules, in order to develop the memory cell according to the invention and thus the corresponding semiconductor memory constructed from a multiplicity of such memory cells.

What is claimed is:

1. A single-port memory cell arrangement
   (a) having a multiplicity of single-port memory cells, (a1) which each have a memory transistor and a selection transistor which are connected in series via their load paths and are arranged between a data line and a supply line, (a2) the control terminal of each selection transistor being connected to a respective word line,
   (a3) a supply potential being applied to the respective memory transistor at the control terminal,
   (b) having at least one controllable switch arranged between the supply line and the load path of the memory transistor, (b1) the load path of the respective memory transistor being arranged between the load paths of the controllable switch and the respective selection transistor, (c) having a single charging device assigned to the multiplicity of single-port memory cells, (c1) which charging device has a precharge circuit for providing a precharging potential and (c2) which charging device, via the supply line and the respective controllable switch, recharges the corresponding memory transistor of the assigned single-port memory cells from time to time with the charging potential, (d) the memory transistors can be charged, via the data line to a first potential for a digital "1" and to a second potential for a digital "0", (d1) the first potential, the second potential and the supply potential being chosen in such a way that the source and drain terminals of the respective memory transistor have the same potential.

2. The single-port memory cell arrangement as claimed in claim 1, wherein each of the single-port memory cells has a controllable switch arranged within the memory cell.

3. The single-port memory cell arrangement as claimed in claim 1, wherein the respective memory transistor and associated selection transistor are designed as CMOS transistors.

4. The single-port memory cell arrangement as claimed in claim 1, wherein the charging device is arranged outside a cell array containing the single-port memory cells.

5. The single-port memory cell arrangement as claimed in claim 4, wherein the charging device has a sense amplifier and the one sense amplifier and/or the precharge circuit are part of a bit line decoder of a semiconductor memory.

6. The single-port memory cell arrangement as claimed in claim 1, wherein the charging device has a clocked ring counter which, via its counter reading, generates an address for a respective one of the memory cells at regular time intervals and via which the charging device automatically recharges the respective memory transistor.

7. A single-port semiconductor memory having
a cell array containing at least one single-port memory cell arrangement having
a multiplicity of single-port memory cells, which each have a memory transistor and a selection transistor which are connected in series via their load paths and are arranged between a data line and a supply line, the control terminal of each selection transistor being connected to a respective word line, a supply potential being applied to the respective memory transistor at the control terminal,
at least one controllable switch arranged between the supply line and the load path of the memory transistor,
the load path of the respective memory transistor being arranged between the load paths of the controllable switch and the respective selection transistor, and
a plurality of charging devices assigned to the respective single-port memory cell arrangements, the charging devices being arranged outside the cell array.

8. A single-port memory cell arrangement comprising:
a multiplicity of single-port memory cells, each of said single-port memory cells comprising:
a selection transistor having
a control terminal connected to a word line, and
a selection-transistor-load-path having a first and second end, said first end being connected to a data line,
a memory transistor having
a control terminal connected to a supply potential,
a memory-transistor-load-path having a first end and a second end, said first end of said memory-transistor-load-path being connected to said second end of said selection-transistor-load-path, and
said memory transistor being configured to switch, in response to a signal on said data line, between a first potential corresponding to binary "0" and a second potential corresponding to binary "1", said first potential, said second potential, and said supply potential being selected such that first and second ends of said memory-transistor-load-path are at the same potential,
a controllable switch having
a first terminal connected to a supply line, and
a second terminal connected to said second end of said memory-transistor-load-path; and
a single charging device assigned to the multiplicity of single-port memory cells, said charging device
including a precharge circuit for providing a precharging potential, and
being configured to, from time to time, recharge a selected memory transistor from said multiplicity of single-port memory cells through said supply line and a selected controllable switch corresponding to said selected memory transistor.

9. The single-port memory cell arrangement of claim 8, wherein said memory transistor comprises a CMOS transistor and said selection transistor comprises a CMOS transistor.

10. The single-port memory cell arrangement as claimed in claim 8, wherein said charging device is arranged outside a cell array containing said multiplicity of single-port memory cells.

11. The single-port memory cell arrangement as claimed in claim 10, wherein said precharge circuit is part of a bit line decoder of a semiconductor memory.

12. The single-port memory cell arrangement as claimed in claim 10, wherein said charging device further comprises a sense amplifier, said sense amplifier being part of part of a bit line decoder of a semiconductor memory.

13. The single-port memory cell arrangement as claimed in claim 8, wherein said charging device comprises a clocked ring counter having a counter reading indicative of an address of a memory cell having a memory transistor to be recharged.

14. A single-port semiconductor memory comprising:
a cell array of single-port memory cells, each of said single-port memory cells including
a selection transistor having
a control terminal connected to a word line, and
a selection-transistor-load-path having a first and second end, said first end being connected to a data line,
a memory transistor having
a control terminal connected to a supply potential,
a memory-transistor-load-path having a first end and a second end, said first end of said memory-transistor-load-path being connected to said second end of said selection-transistor-load-path, and
said memory transistor being configured to switch, in response to a signal on said data line, between a first potential corresponding to binary "0" and a second potential corresponding to binary "1", said first potential, said second potential, and said supply potential being selected such that first and second ends of said memory-transistor-load-path are at the same potential,
a controllable switch having
   a first terminal connected to a supply line, and
   a second terminal connected to said second end of said memory-transistor-load-path; and
a plurality charging devices, each of said charging devices being assigned to a subset of said single-port memory cells and being disposed outside said cell array, each of said charging devices including a precharge circuit for providing a precharging potential, and
being configured to, from time to time, recharge a selected memory transistor from said multiplicity of single-port memory cells through said supply line and a selected controllable switch corresponding to said selected memory transistor.

* * * * *